United States Patent
Sasaki et al.

(10) Patent No.: US 7,535,220 B2
(45) Date of Patent: May 19, 2009

(54) BEAM MEASURING EQUIPMENT AND BEAM MEASURING METHOD USING THE SAME

(75) Inventors: Yuichiro Sasaki, Tokyo (JP); Tamaki Watanabe, Tokyo (JP); Takeo Kawaguchi, Hyogo (JP); Shinichi Watanabe, Saitama (JP); Takeshi Katayama, Tokyo (JP); Bunji Mizuno, Nara (JP); Hisataka Kanada, Osaka (JP)

(73) Assignee: Panasonic Corporation, Osaka (JP)

( * ) Notice: Subject to any disclaimer, the term of this patent is extended or adjusted under 35 U.S.C. 154(b) by 360 days.

(21) Appl. No.: 10/597,838

(22) PCT Filed: Feb. 10, 2005

(86) PCT No.: PCT/JP2005/002075

§ 371 (c)(1),
(2), (4) Date: Sep. 27, 2006

(87) PCT Pub. No.: WO2005/076039

PCT Pub. Date: Aug. 18, 2005

(65) Prior Publication Data

US 2008/0024126 A1    Jan. 31, 2008

(30) Foreign Application Priority Data

Feb. 10, 2004   (JP) ............... 2004-033714

(51) Int. Cl.
*G01R 33/035*   (2006.01)
(52) U.S. Cl. .................. 324/248
(58) Field of Classification Search ........ 324/244, 324/248, 71.3, 71.6, 117 R; 505/190–191, 505/162; 250/492.21, 398, 423 R, 251, 427, 250/492.2, 437; 335/216; 338/32; 365/160
See application file for complete search history.

(56) References Cited

FOREIGN PATENT DOCUMENTS

| | | |
|---|---|---|
| JP | 48-29808 Y1 | 9/1973 |
| JP | 03-067410 A | 3/1991 |
| JP | 05-164827 A | 6/1993 |
| JP | 2003-155407 | 5/2003 |

(Continued)

OTHER PUBLICATIONS

Kuchnir et al., "Squid Based Beam Current Meter", IEEE Transactions on Magnetics, vol. Mag-21, No. 2, Mar. 1985, pp. 997-999.

(Continued)

*Primary Examiner*—Reena Aurora
(74) *Attorney, Agent, or Firm*—Pearne & Gordon LLP

(57) ABSTRACT

A measuring device includes a magnetic shielding part for shielding an outer magnetic field, and a plurality of magnetic field sensors which are arranged in a shielding space which is formed by the magnetic shielding part, wherein the magnetic field sensor includes a plurality of magnetic field collection mechanisms which collect magnetic fields which the beam current to be measured generates, and the magnetic field collection mechanism is a cylindrical structural body which has at least a surface thereof formed of a superconductive body and includes a bridge portion which has only a portion thereof formed of a superconductive body on an outer peripheral portion thereof, and a magnetic field which the beam current to be measured generates is measured by the magnetic field sensors. Due to the arrangement of the plurality of magnetic field sensors, a beam position and a beam current can be detected.

13 Claims, 15 Drawing Sheets

FOREIGN PATENT DOCUMENTS

| | | |
|---|---|---|
| JP | 2003-331848 | 11/2003 |
| JP | 2004-356573 A | 12/2004 |
| WO | 2005/029100 A1 | 3/2005 |

OTHER PUBLICATIONS

Hao et al., "Design and Performance of an HTS Current Comparator for Charged-Particle-Beam Measurements", IEEE Transactions on Applied Superconductivity, vol. 11, No. 1, Mar. 2001, pp. 635-638.

Grohmann et al., "A Cryodevice for Induction Monitoring of DC Electron or Ion Beams with Nano-Ampere Resolution", "Superconducting Quantum Interference Devices and Their Applications", Physikalisch-Technische Bundesanstalt, Institute Berlin, Abbestr. 2-12, D-1 Berlin 10, Germany, p. 311, 1997.

Watanabe et al., "Results of a First Beam Test of HTS Squid Current Monitor", Center for Nuclear Study, Graduate School of Science, University of Tokyo, p. 71.

Peters et al., "Review of the Experimental Results with a Cryogenic Current Comparator".

International Search Report for PCT/JP2005/002075, May 17, 2005.

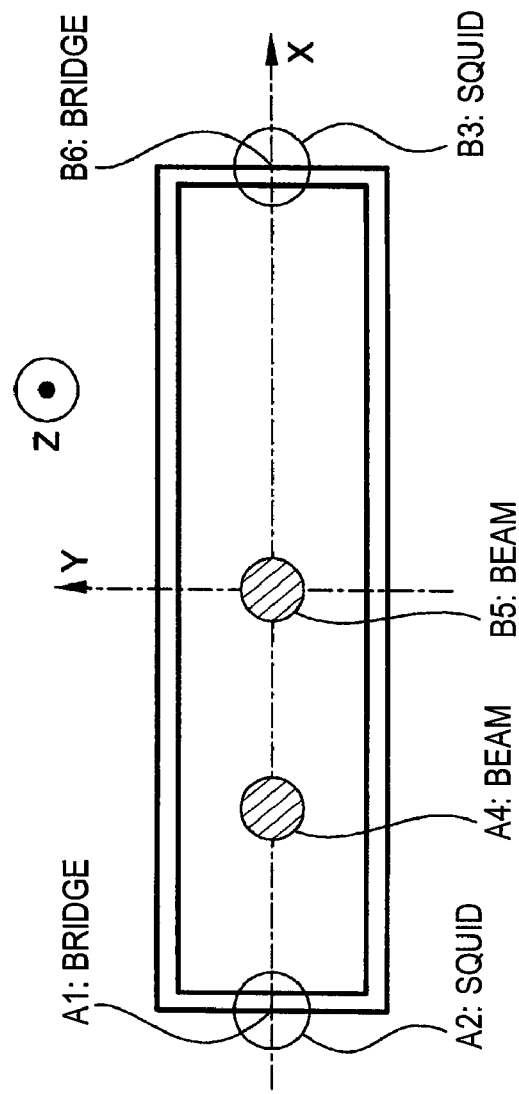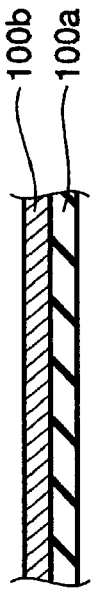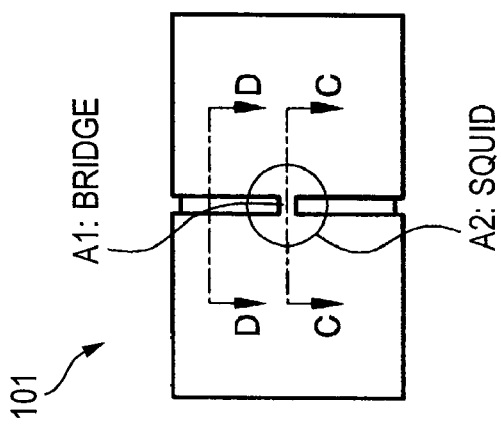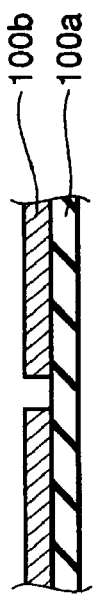

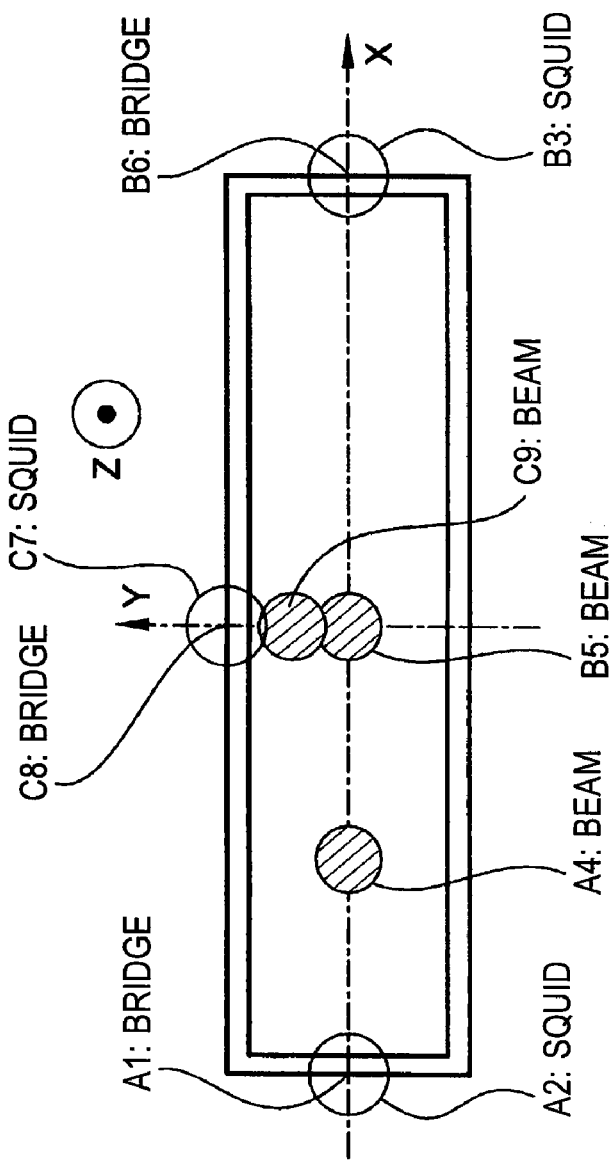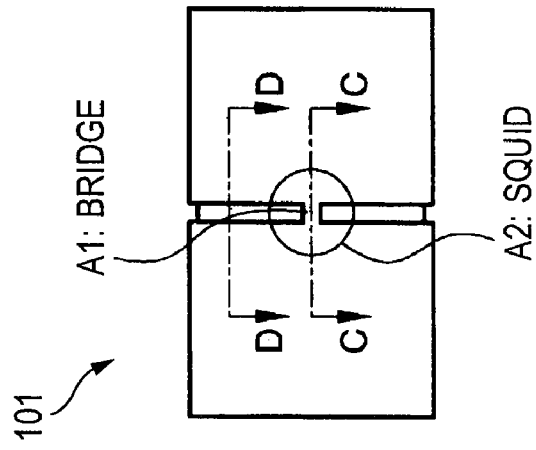

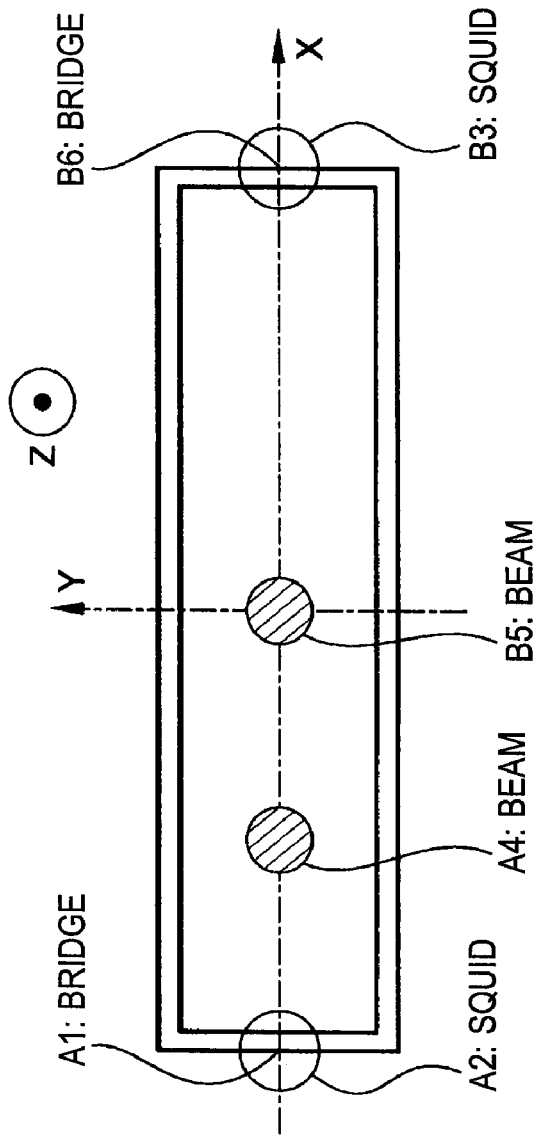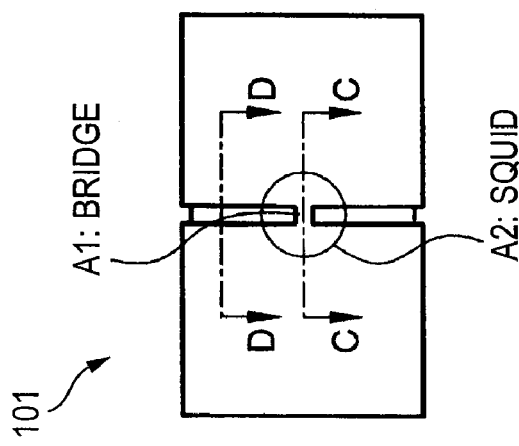

BEAM MEASURING EQUIPMENT AND BEAM MEASURING METHOD USING THE SAME

TECHNICAL FIELD

The present invention relates to a beam measuring device and a beam measuring method which uses the beam measuring device, and more particularly to a device which measures a beam current value and a position without interrupting ion beams.

BACKGROUND OF THE INVENTION

As a method for measuring a current value of ion beams without interrupting the beams with high accuracy, several studies have been reported conventionally (see non-patent document 1). This method measures a beam current value by detecting a magnetic field which a beam current generates using a sensor which is referred to as SQUID which uses a Josephson coupling method which is an extremely sensitive magnetic field sensor. The SQUID includes one (RF-SQUID) or two (DC-SQUID) Josephson junctions in a super-conductive ring, and measures a magnetic flux which penetrates the super-conductive ring using a magnetic flux quantum ($2.07 \times 10^{-15}$ Wb) as a scale.

In the above-mentioned document, the SQUID which uses a low-temperature superconductive body which is operated at a temperature of liquefied helium is used. Further, the beam current measuring device has a main part thereof constituted of a detecting part which detects a magnetic field corresponding to a beam current, a magnetic flux transmitting part which transmits a magnetic flux to a measuring part, the measuring part which includes a superconductive element which responses to the transmitted magnetic flux and a feedback coil which allows a feedback current such that the feedback current cancels a change of the magnetic flux which penetrates the superconductive element, and a magnetic shielding part made of a superconductive body and having a gap which magnetically shields the detecting part, the magnetic flux measuring part and the measuring part from an outer space which includes a space in which ion beams flow.

The detecting part is a coil which is formed by winding a super conductive line on a core made of a soft magnetic core and induces a superconductive current into the coil by collecting magnetic fields which are generated by the beam current by the soft magnetic core. Then, this superconductive current induced in the coil is transmitted to the coil which is arranged close to the SQUID. That is, in response to the change of the beam current, the superconductive current which flows in the coil is changed thus changing a quantity of magnetic flux which flows in the SQUID. The feedback coil is provided for allowing the feedback current to flow so as to cancel the change of the magnetic flux. The feedback current is proportional to the change of the beam current value and the change quantity of the beam current value can be determined by measuring the feedback current.

Recently, a measuring method of the beam current value using a high-temperature superconductive body has been studied (see non-patent document 2). According to the method described in this non-patent document 2, a cylinder which has a surface thereof coated with a high-temperature superconductive body constitutes a detecting part. However, on an outer peripheral surface of the cylinder, a bridge portion which has a portion thereof made of a high-temperature superconductive body is formed. A beam current which penetrates the center of the cylinder induces a surface shielding current on a surface of the cylinder. Here, the surface shielding current concentrates on the bridge portion. Then, a magnetic flux which is generated by the concentrated surface shielding current is measured by a SQUID. The SQUID which is used in this method uses the high-temperature superconductive body and is operable at a liquefied nitrogen temperature or more.

The beam current measuring device which uses the former SQUID made of the low-temperature superconductive body can measure the beam current with a noise band corresponding to several nA.

On the other hand, the beam current measuring device which uses the latter SQUID made of the high-temperature superconductive body has an advantage that the measuring device can be operated with only liquefied nitrogen or a freezer, a noise band is considered to be large, that is, around several µA (see non-patent literature 2). Further, a drift on a zero point is considered to be large and there has been a drawback that, in an actual measurement for several tens seconds or more, the measuring device can only measure the beam current substantially corresponding to 10 µA or more. To the contrary, there has been a report that by designing the magnetic shielding such that the sensitivity of the high-temperature superconductive SQUID is optimized, ion beams of 1.8 µA are successfully measured (see patent document 1, patent document 2, non-patent document 3). Here, the noise band corresponding to 0.5 µA. In this manner, recently, the studies and developments of the high-temperature superconductive SQUID have been in progress.

In other non-destructive measuring method, a DC current transformer is used. The noise band is approximately 0.5 µA to several µA although the noise band depends on the design of the magnetic shielding.

Non patent literature 1: Superconducting Quantum Interference Devices and Their Applications (Walter de Gruyter, 1977) p. 311,IEEE TRANSACTIONS ON MAGNETICS, VOL. MAG-21, NO. 2, MARCH 1985,Proc, 5$^{th}$ European Particle Accelerator Conf., Sitges, 1996 (Institute of Physics, 1997) p. 1627, Publication of Japan society of physics Vol. 54, No. 1, 1999

Non patent literature 2: IEEE TRANSACTION ON APPLIED SUPERCONDUCTIVITY, VOL. 11, NO. 1, MARCH 2001 p. 635

Non patent literature 3: CNS annual report

Patent literature 1: Japanese Patent Application 2003-155407

Patent literature 2: Japanese Patent Application 2003-331848

DISCLOSURE OF INVENTION

Problems to be Solves by the Invention

Although various non-destructive measuring methods have been proposed, the sensitivity to the beam current is high and hence, these measuring methods cannot measure the current value and the position of the beams simultaneously.

Accordingly, in a beam line of an accelerator or an ion implanting apparatus, for example, a Faraday cup and a beam profile monitor are respectively arranged. Further, currently, results which are obtained by respective measurements are combined and the current value and the position of the beams are grasped based on the combined results.

Under such circumstances, there has been a demand for a beam measuring device which can measure beams in a non-destructive manner can measure a beam current value with high accuracy, and can also grasp positions of the beam.

The present invention has been made under such circumstances and it is an object of the present invention to provide a beam measuring device which can realize the non-destructive measurement of a beam current value with high accuracy and also can measure positions of the beams.

Means for Solving the Problem

To achieve the above-mentioned object, according to the present invention, a measuring device includes a magnetic shielding part for shielding an outer magnetic field, and a plurality of magnetic field sensors which are arranged in a shielding space which is formed by the magnetic shielding part, wherein the magnetic field sensor includes a plurality of magnetic field collection mechanisms which collect magnetic fields which the beam current to be measured generates, and the magnetic field collection mechanism concentrates a superconductive surface shielding current which the beam current generates in the vicinity of the respective magnetic field sensors.

Inventors of the present invention, based on results of various experiments carried out using high-temperature superconductive bodies and studies on the principle of a mechanism which collects magnetic fields generated by a beam current to be measured, have found out that with the provision of a plurality of mechanisms which collect the magnetic fields, it is possible to measure not only a beam current value but also positions of the beams. The present invention has been made by focusing on this point.

Further, in the beam measuring device of the present invention, the magnetic field collection mechanisms are arranged such that the beam current is concentrated on a predetermined region since a superconductive surface shielding current is interrupted within a range of a fixed length in a plane which the beam current penetrates except for a predetermined region. Due to such a method, it is possible to efficiently take out the surface shielding current.

Further, the beam measuring device of the present invention includes the magnetic field collection mechanism which is a cylindrical structural body having at least a surface thereof formed of a superconductive body and having a bridge portion which has only a portion thereof constituted of a high-temperature superconductive body on an outer peripheral portion.

According to this method, it is possible to efficiently concentrate the shielding current in a state that the magnetic field collection mechanism possesses the extremely small resistance.

Further, the beam measuring device of the present invention includes magnetic field collection mechanism which is constituted of a plurality of superconductive coils.

Due to such a constitution, it is possible to increase the degree of freedom with respect to the magnetic field sensor arrangement position.

Here, it is preferable to arrange the magnetic field collection mechanism in the vicinity of the magnetic field sensor. However, when the superconductive coil is used as the magnetic field collection mechanism, the superconductive coil maybe arranged in a spaced-apart manner from the magnetic field sensor. That is, the superconductive coil maybe arranged close to the beam current and the magnetic field sensor may be arranged in a spatial range which is highly magnetically sealed and has small noises. Then, a superconductive circuit which transmits the magnetic field which the beam current collected by the superconductive coil generates to the magnetic field sensor may be introduced. Although the superconductive circuit, currently, can be formed only with the low-temperature superconductive body which has the high degree of freedom of shape, when the superconductive coil is used, it is possible to introduce the superconductive circuit which can transmit the magnetic field simultaneously and hence, it is possible to form the superconductive coil without arranging the superconductive coil in the vicinity of the beam current.

Further, the beam measuring device of the present invention includes the superconductive coil which is wound around a core which is constituted of a soft magnetic body.

Due to such a constitution, it is possible to obtain the higher sensitivity.

According to the present invention, by constituting the beam measuring device using a plurality of magnetic field sensors and by calculating signals which are measured by the respective magnetic field sensors, it is possible to measure not only the beam current value but also the position of the beams.

Due to such a constitution, it is possible to provide the beam measuring device which can measure the beams in the non-destructive measurement with a noise width less than approximately 0.5 µA, and can measure the position of the beam simultaneously.

Further, according to the present invention, by performing the calculation such that noise signals having the same phase as output signals of the plurality of magnetic field sensors can be cancelled from such output signals, the noise width can be made further smaller thus enabling the measurement with high accuracy.

Further, the magnetic field sensor may preferably be a SQUID.

Here, the use of the high-temperature superconductive body is preferable since the beam measuring device is operable at a liquid nitrogen temperature or more. With the use of the high-temperature superconductive body, a running cost can be reduced and, at the same time, a thickness of a shielding portion can be reduced thus realizing the miniaturization of the beam measuring device.

For example, by applying the beam measuring device to an ion implantation device which is required to measure the beam current of several µA to several tens mA with high accuracy, it is possible to measure the current value and the positions of the beams in a non-destructive manner simultaneously by radiating ion beams to a semiconductor wafer.

Further, the beam current and position measuring method of the present invention uses the above-mentioned beam measuring device, arranges the beam measuring device on the beam line which is radiated to a material to be treated from an ion source or an electron beam source, and measures the beam current value of the beam line and the position of ion beams based on outputs of the magnetic field sensors.

It is desirable to simultaneously measure the beam current value of the beam line and the position of the ion beams since such simultaneous measurement enables the efficient control and adjustment of beams.

Further, the beam control method of the present invention includes a measurement step which measures a beam current of beams which are generated using an ion source or an electron beam source using the above-mentioned beam current and position measuring method, and a control step which feedbacks the beam current value and positions of beams which are obtained by the measuring step or both of the beam current value and the positions of beams to control parameters of the ion source, the electron beam source, an analysis electric magnet, a part for applying an electric field and a magnetic field to the beams.

Further, a beam radiation method of the present invention is characterized by including a radiation step which radiates the beam current which is controlled using the control parameters obtained by the beam control and adjustment step to a material to be treated with respect to the beams generated using the ion source or the electron beam source.

Further, according to the beam irradiation device which uses the above-mentioned beam measuring device, it is possible to perform the beam radiation while controlling the beam current value and the position with high accuracy and hence, the working of high accuracy can be realized. Further, the adjustment of the beams is facilitated.

Further, the present invention is also effectively applicable to an active element such as a semiconductor, liquid crystal, a bio chip, a passive element such as resistance, coil, a capacitor or the like, an electric line or the like which is manufactured or inspected using an ion injection device, an electronic beam exposure device, an accelerator or an electron beam vapor deposition device which includes the above-mentioned beam measuring device.

Advantage of the Invention

According to the present invention, with the use of the plurality of magnetic field sensors, it is possible to measure not only a beam current but also a position of beams easily and in a non-contact manner.

BRIEF DESCRIPTION OF THE DRAWINGS

FIG. 3 is a view for explaining the relationship between the magnetic field sensor and beam positions of the first embodiment of the present invention.

FIG. 5 is a view for explaining the relationship between the magnetic field sensor and beam positions of the second embodiment of the present invention.

FIG. 9 is a view showing a schematic appearance of the magnetic field sensor of the fourth embodiment of the present invention.

In the drawing:

11: detection coil, 12: SQUID, 13: feedback coil, 15: SQUID input coil, 100: mechanism which collects magnetic field, 100a: base body which is formed of insulator or a normal conductive body, 100b: high-temperature superconductive body, 101: bridge part, S: slit

BEST MODE FOR CARRYING OUT THE INVENTION

Next, embodiments of the present invention are explained in detail in conjunction with the drawings.

First Embodiment

Figure 1:
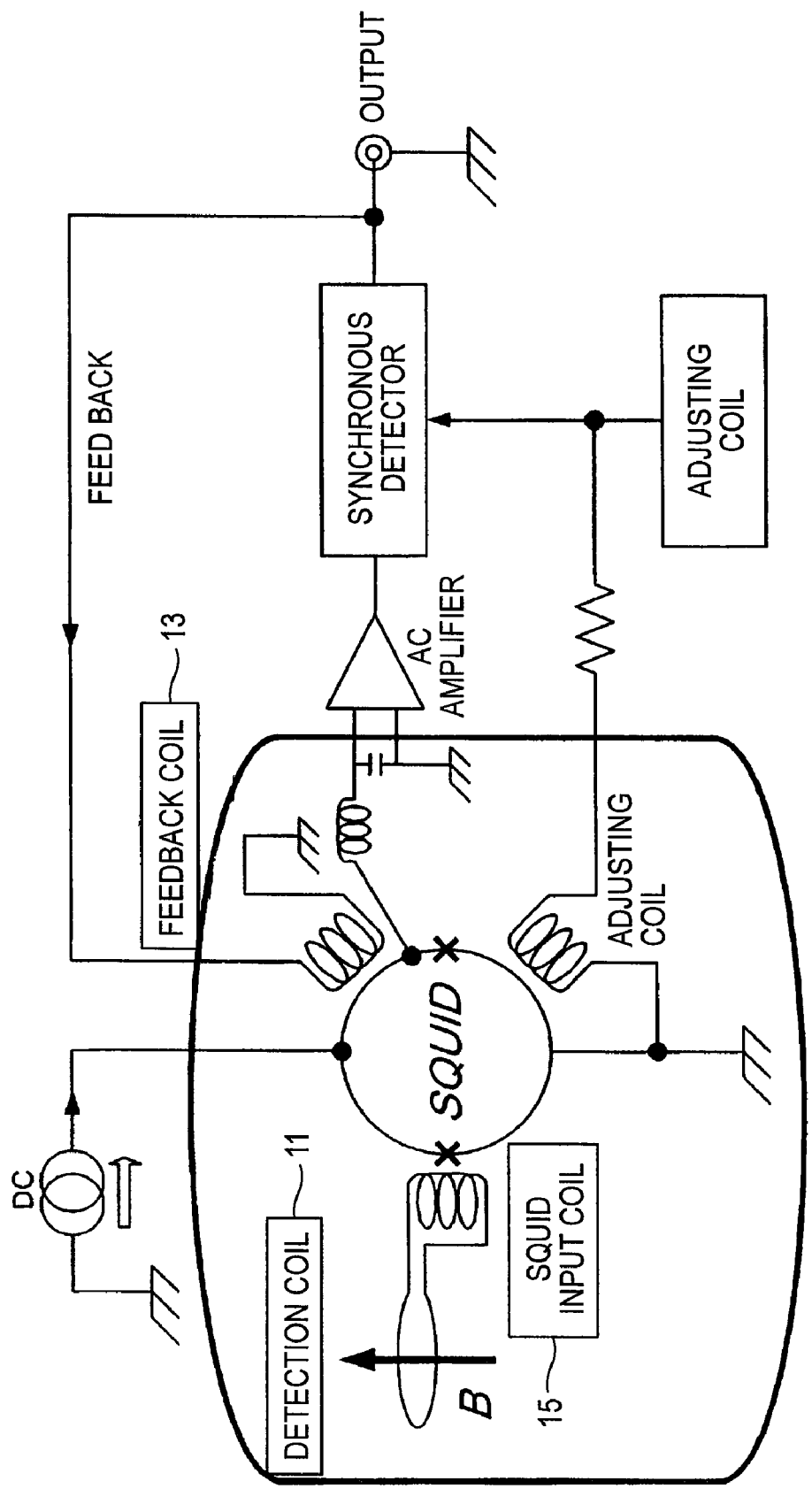
FIG. 1 is a view showing a circuit diagram of a high temperature superconducting SQUID and a flux-locked loop used in a beam measurement device of a first embodiment of the present invention.

FIG. 1 is an explanatory view showing a circuit diagram of a high-temperature superconductive SQUID and a flux-locked loop used in a beam measuring device of the embodiment of the present invention.

The beam measuring device includes a magnetic shielding part for shielding an external magnetic field and a plurality of magnetic field sensors which are arranged in a shielded space formed by the magnetic shielding part, wherein the beam measuring device is characterized in that the magnetic field which a beam current to be measured generates is measured by the magnetic field sensor. The beam measurement device, as shown in FIG. 1, includes a detection coil 11 which is arranged in a path of a beam to be measured, a SQUID 12 which constitutes a magnetic field sensor which detects the magnetic field corresponding to the beam current, a magnetic flux transmitting part which is constituted of the detection coil 11 and a closed circuit of a SQUID input coil 15 and transmits the magnetic flux detected by the detection coil 11 to a measuring part, and a feedback coil 13 which allows a feedback current to flow so as to cancel a change of the magnetic flux which penetrates the SQUID, wherein the beam measurement device is configured such that an output of the SQUID 12 is supplied to an output terminal through a preamplifier and an integrator and, at the same time, the output of the SQUID 12 is fed back to the feedback coil 13. Here, in order to erase noises intrinsic to low frequencies of a Josephson element, an AC current is biased to the beam measuring device.

A surrounded portion shown in FIG. 1 indicates a low temperature portion which is formed of the detection coil 11, the magnetic flux transmitting part and the feedback coil 13 and the low temperature portion is fixed to a holder having a diameter of approximately φ4 cm and a height of approximately 2 cm. With respect to the holder in FIG. 2 to FIG. 8, for the sake of convenience, a part of the low temperature portion which is included in the holder is shown as the SQUID in a representing manner. In addition, when a plurality of SQUIDs is depicted in the drawing, each SQUID is identified as a SQUID_A, a SQUID_B and the like with suffixes.

Figure 2:
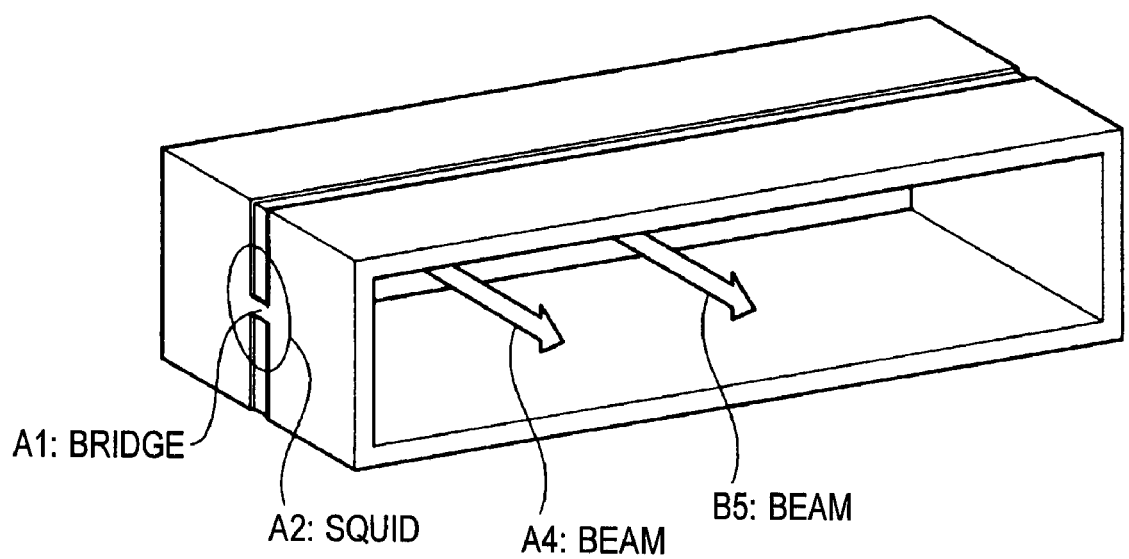
FIG. 2 is a view showing a schematic appearance of a magnetic field sensor of the first embodiment of the present invention.

The SQUID is, as shown in FIG. 2, arranged in the vicinity of a mechanism which collects a magnetic field generated by the beam current to be measured. The mechanism 100 which collects the magnetic field is formed of a cylindrical structural body which has a surface thereof coated with a high-temperature superconductive body 100b and has a bridge portion 101 which has only a portion thereof constituted of a high-temperature superconductive body on an outer peripheral portion. When the beam penetrates a closed curved surface defined by an inner diameter of the cylindrical structural body, a surface shielding current is induced on an inner wall surface of the cylindrical structural body by the magnetic field generated by the beams. The surface shielding current flows in the direction opposite to the advancing direction of the beams on the inner wall surface of the cylindrical structural body. On the other hand, the surface shielding current flows in the same or forward direction as the advancing direction of the beam on the outer wall surface so that the surface shielding current makes a turn. Here, since the outer wall surface of the cylindrical structural body includes the bridge portion 101 which is superconductive under high temperature only at a portion thereof and forms a slit portion S having no high-temperature superconductive body 100b, the current does not flow into the portion where a base body 100a which is either an insulator or a normal conductor is exposed, thus the surface breaking current concentrates on the bridge portion. In this manner, the magnetic field generated by the beam current to be measured is collected. Further, the magnetic field which the concentrated surface shielding current generates at the bridge portion is detected using the detection coil and is measured by the SQUID.

FIG. 3(b) is a cross-sectional view of the cylindrical structural body of FIG. 1 as viewed in the advancing direction of the beams in order to explain the constitutional features of the present invention, and FIG. 3(a) is a drawing of the cylindrical structural body as viewed in the direction perpendicular to the advancing direction of the beam. As shown in FIG. 3(b), a cross-section of the cylindrical structural body obtained by cutting in the direction perpendicular to the advancing direction of the beams is a rectangular shape. On two short sides of the rectangular shape, SQUIDs are respectively arranged. FIG. 3(c) and FIG. 3(d) are drawings showing an essential part of the configuration of the cylindrical structural body.

A beam_B5 is a beam which passes through the center of the rectangular shape. Outputs of the SQUID_A2 and the SQUID_B3 with respect to the beam_B5 are equal.

Hereinafter, the measuring principle is explained in detail. Due to a magnetic field generated by the beam, on respective portions of an inner wall surface of the cylindrical structural body, a surface shielding current having a current value which differs depending on a magnitude of the magnetic field generated by the beam is induced. That is, assuming a distance from the center of the beam as R, the magnetic field which the beam generates is attenuated in proportion to 1/R. Accordingly, while the surface shielding current having a large current value per unit area is induced in the portion of the inner wall of the cylindrical structural body which is close to the beam center, the surface shielding current having a small value per unit area is induced in the portion of the inner wall which is apart from the beam center. Here, the distribution of the surface shielding current which the beam_B5 induces on the inner wall is symmetrical with respect to an YZ plane. The surface shielding current which is induced on the inner wall flows in the same or forward direction as the advancing direction of the beam on the inner wall surface and, thereafter, turns around to an outer wall surface and flows on the outer wall surface in the same or forward direction as the advancing direction of the beam. On the outer wall surface of the cylindrical structural body, there exist two paths such as a bridge_A1 and a bridge_B6, wherein the two paths are symmetrical with respect to the YZ plane and a half of the total surface shielding current which is induced on the inner wall flows to the bridge_A1 and the bridge_B6 respectively. In this manner, the outputs of the SQUID_A2 and the SQUID_B3 are equal.

On the other hand, as indicated by the beam_A4, when the beam passes a position in the minus direction along the X axis using the center of the rectangular as an origin, the outputs of the SQUID_A2 and the SQUID_B3 are not equal. In this case, the distribution of the surface shielding current which the beam_A4 induces on the inner wall is asymmetrical with respect to the YZ plane. That is, on the inner wall at the minus side of the X axis, the surface shielding current having a large current value compared to the plus side is distributed and flows. Further, after the surface shielding current flows on the inner wall surface in the same or forward direction as the advancing direction of the beam, the surface shielding current turns around to the outer wall surface while maintaining the substantially equal distribution. Then, the surface shielding current which flows along the outer wall at the minus side of the X axis flows toward a bridge_A1, while the surface shielding current which flows along the outer wall at the plus side of the X axis flows toward a bridge_B6 respectively. Accordingly, the output of the SQUID_A2 is large compared to the output of the SQUID_B3. Further, the larger a distance between the position of the beam displaced in the minus direction of the X axis and an origin, the output of SQUID_A2 becomes larger than the output of the SQUID_B3.

By making use of this phenomenon, it is possible to measure the position of the beam on the X axis. That is, assuming outputs of the SQUID_A2 and the SQUID_B3 as $V_A(X)$, $V_B(X)$ respectively, a length of a long axis of the cylindrical structural body shown in FIG. 3(b) as D, and a position sensitivity ratio as $\alpha$, the position of the beam X is calculated by a formula $X=(D/2)\times\alpha\times(V_A(X)-V_B(X))/(V_A(X)-V_B(X))$. Further, even when the beam is displaced from the X axis, since the structure of the cylindrical structural body is symmetrical with respect to the XZ plane shown in FIG. 3(b), it is apparent that an X coordinate of the position which the beam passes through can be measured based on the same principle.

The total sum of the surface shielding current induced on the inner wall surface by the beam current which penetrates the closed curved surface formed by the inner diameter of the cylindrical structural body is fixed irrespective of the position of the beam. By making use of this phenomenon, it is possible to calculate a beam current value by calculating a sum of outputs of the SQUID_A2 and the SQUID_B3. That is, performing the calculation using the outputs of the SQUID_A2 and the SQUID_B3, the position on the X axis where the beam passes and the beam current value can be measured simultaneously.

In the structure which arranges two SQUIDs, the position of the beam can be measured single-dimensionally.

Second Embodiment

Figure 4:
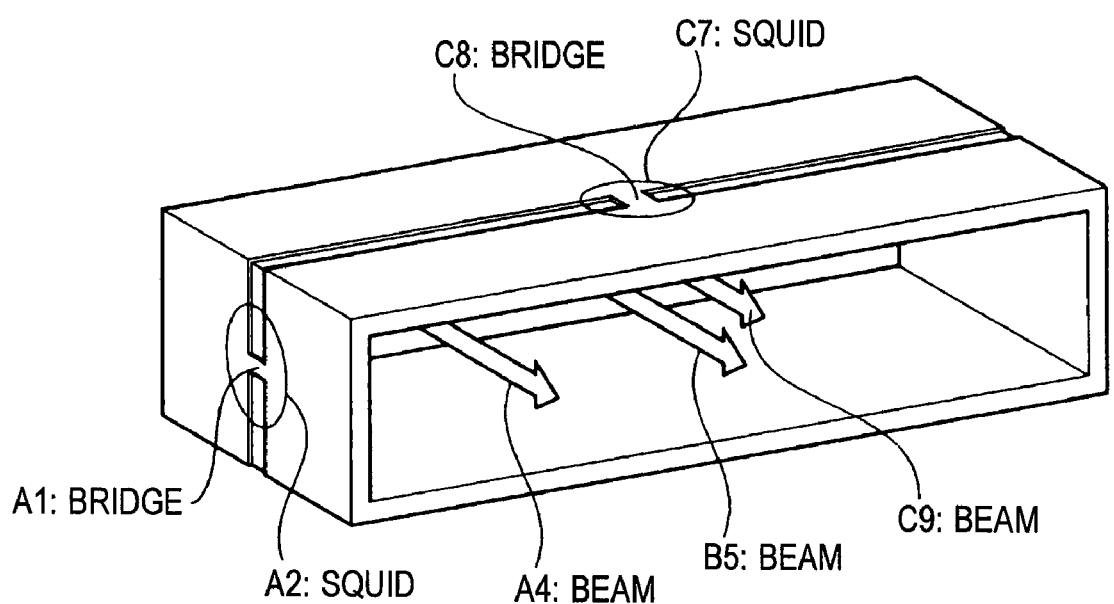
FIG. 4 is a view showing a schematic appearance of a magnetic field sensor of a second embodiment of the present invention.

FIG. 4, FIG. 5(a) and FIG. 5(b) show an example of the constitution which is modified to enable the two-dimensional measurement of the position of the beam by expanding the principle. FIG. 5(b) is a cross-sectional view of the cylindrical structural body shown in FIG. 4 as viewed in the beam advancing direction. Further, FIG. 5(a) is a cross-sectional view of the cylindrical structural body as viewed in the direction perpendicular to the beam advancing direction. In this constitution, three bridges and three SQUIDs are respectively arranged. That is, in addition to the cases shown in FIG. 2, FIG. 3(a) and FIG. 3(b) explained in conjunction with the embodiment 1, a bridge_C8 and a SQUID_7 are added on the Y axis. When the beam passes on the plus side on the Y axis, compared to the case in which the beam passes on the minus side, the output of the SQUID_C7 becomes large, while the outputs of SQUID_A2 and the SQUID_B3 become small. In this manner, a ratio among three SQUIDs varies respectively depending on the position of the beam. In addition, coordinates of the beam position on the XY plane and the ratio among outputs of three SQUIDS correspond to each other in one-to-one correspondence. That is, by calculating the ratio among the outputs of three SQUIDs, it becomes possible to measure the beam position two-dimensionally as the coordinate on the XY plane within the rectangular cross section which is obtained by cutting the cylindrical structural body perpendicular to the advancing direction of the beam. Here, by arranging two SQUIDs on the X axis direction and the Y axis direction respectively, the beam position can be measured two-dimensionally more easily.

Third Embodiment

Figure 6:
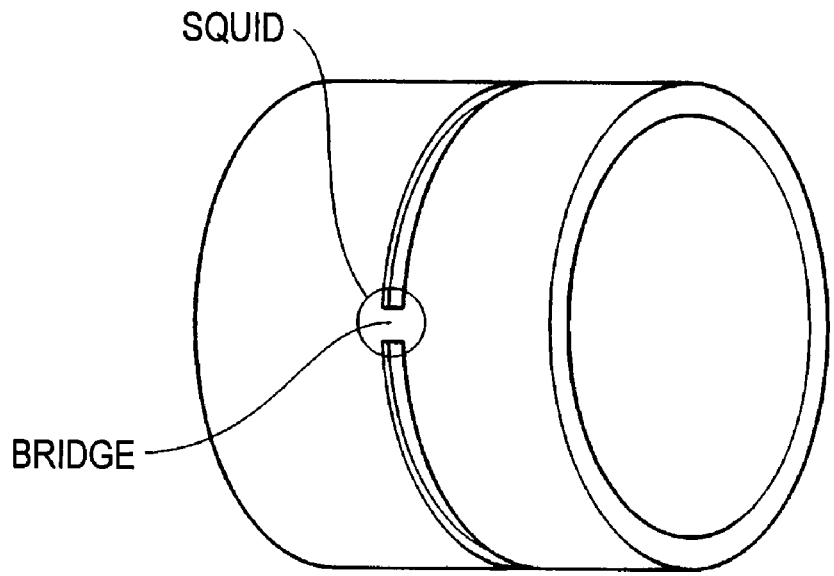
FIG. 6 is a view showing a schematic appearance of a magnetic field sensor of a third embodiment of the present invention.
Figure 6:
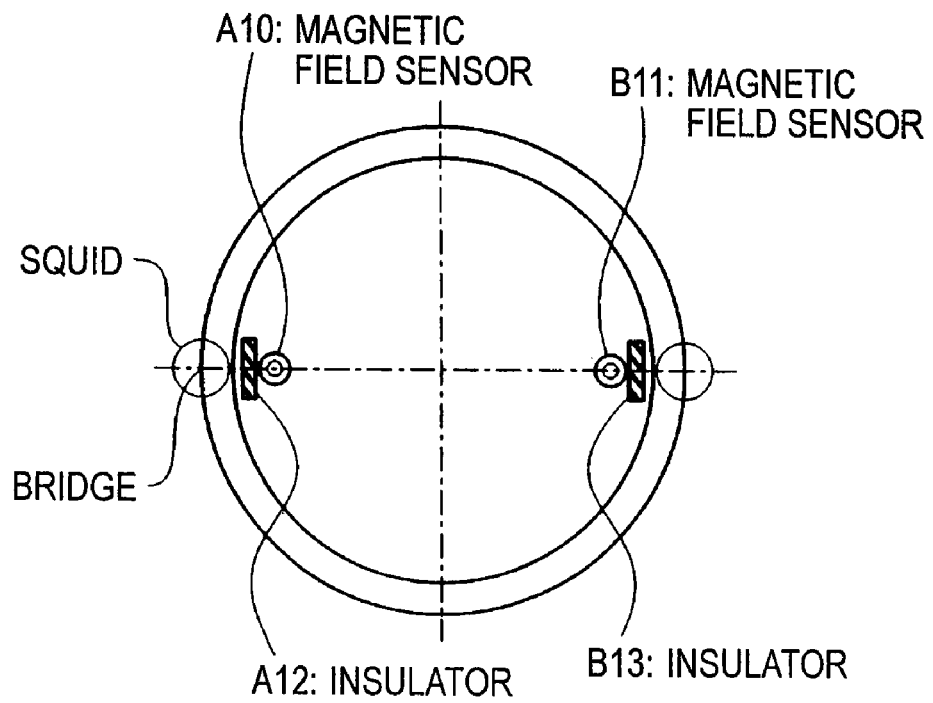

FIG. 6 shows the structure which adopts one bridge and one SQUID and, in addition, two magnetic field sensors. In this embodiment, the cylindrical structural body is constituted of a cylinder. That is, while the embodiment uses three sensors including the SQUID, the embodiment uses one bridge which constitutes a mechanism to collect the magnetic field. Here, as the magnetic field sensor, other sensor may be used in place of the SQUID. Due to such a constitution, it is possible to measure the beam current value using the SQUID, and it is possible to measure the beam position separately using the magnetic field sensor_A10 and the magnetic field sensor_B11.

Fourth Embodiment

Figure 7:
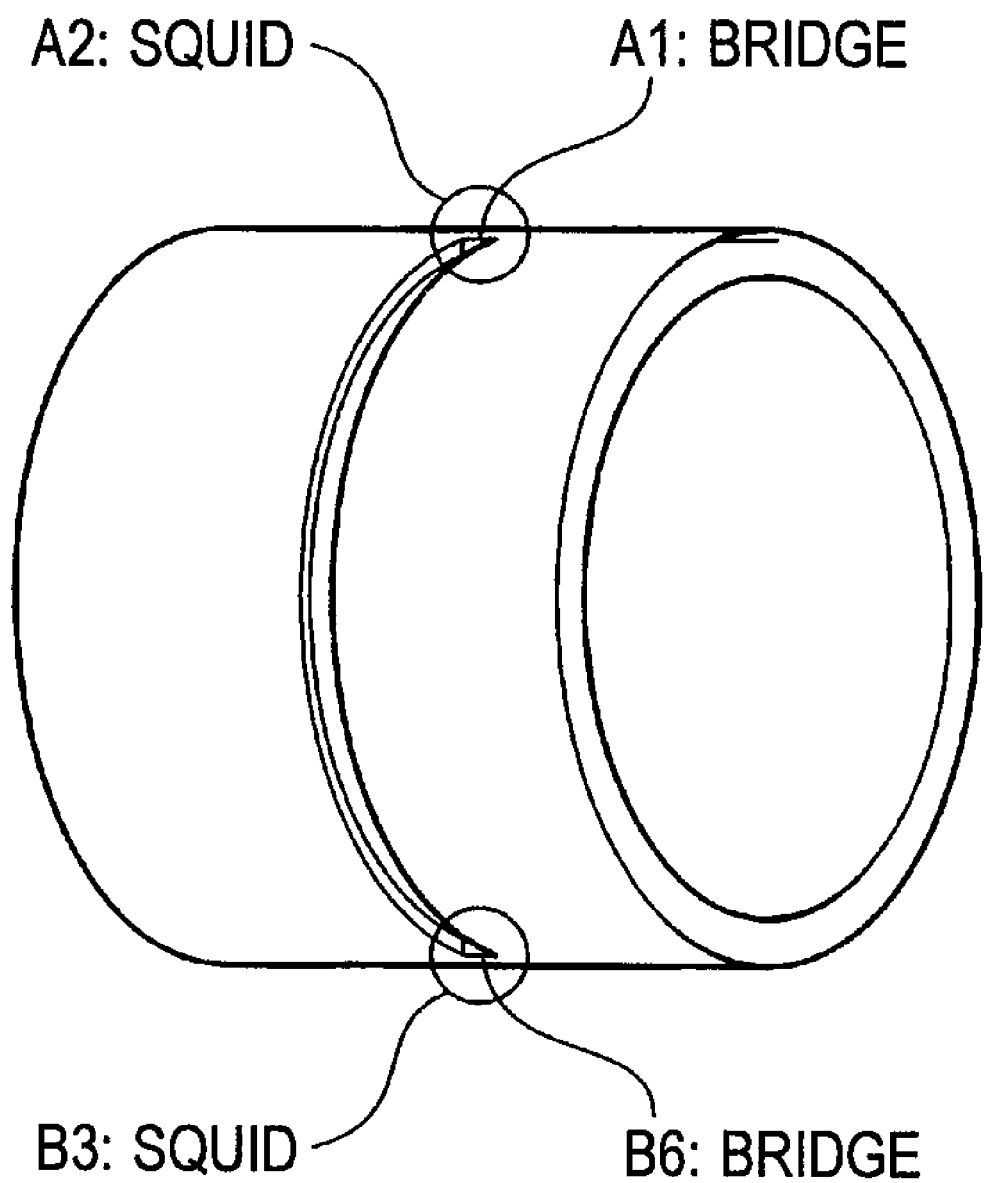
FIG. 7 is a view showing a schematic appearance of the magnetic field sensor of the third embodiment of the present invention.

FIG. 7 shows the structure which is basically same as the structure of the first embodiment shown in FIG. 2 and FIG. 3. However, this embodiment adopts two bridges and two SQUIDs respectively. It is appreciated that by calculating outputs of the SQUID_A2 and the SQUID_B3, it is possible to measure the beam position one-dimensionally with respect to a line which connects a SQUID_A2 and a SQUID_B3 and a beam current value simultaneously.

Figure 8:
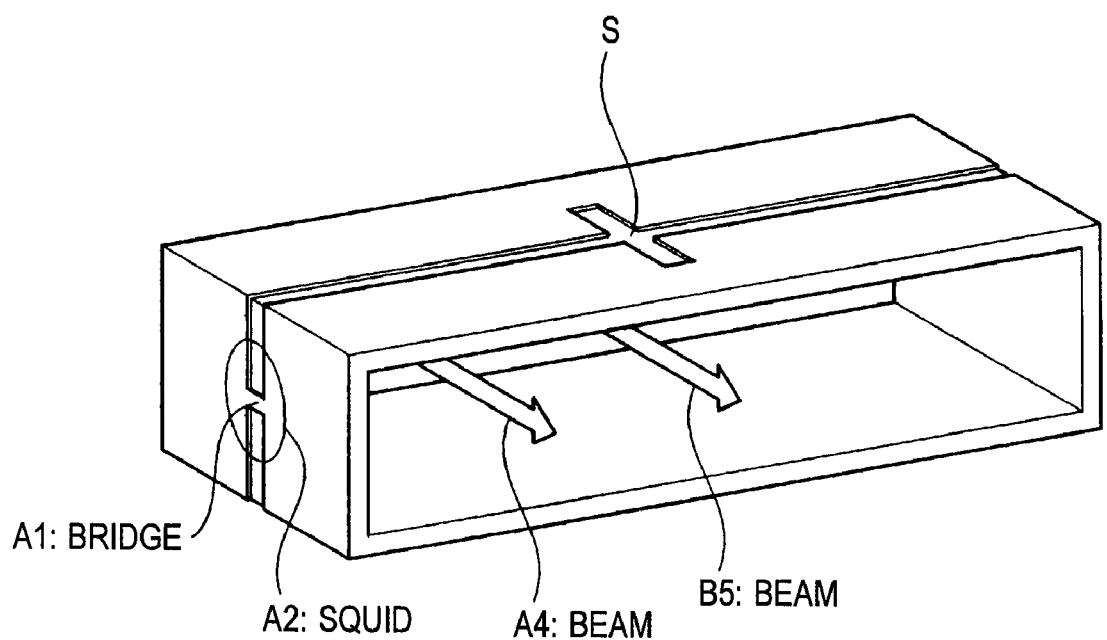
FIG. 8 is a view showing a schematic appearance of a magnetic field sensor of a fourth embodiment of the present invention.

FIG. 8 and FIG. 9 show the structure in which an insulator or a normal conductor is designed such that surface shielding currents which are respectively induced at positive and negative sides of an X axis on an inner wall of a cylindrical structural body are allowed to easily flow toward bridges which are closer to these surface shielding currents respectively. By arranging the insulator or the normal conductor at the center portion of the outer wall of the cylindrical structural body in a state that the insulator or the conductor partitions the bridge_A1 and the bridge_B6, the respective SQUID outputs can easily reflect the beam positions. In this embodiment, in a state that a whole surface of a base body 100a is covered with a superconductive body (100b), by forming a slit S in which the superconductive body is not applied and a base body (100a) is exposed, a bridge_A1 and a bridge_B6 are separated from each other. Here, the insulator or the usual-state superconductive body which separates the bridge_A1 and the bridge_B6 from each other may be also arranged effectively as shown in FIG. 10, FIG. 11, FIG. 12 and FIG. 13.

Fifth Embodiment

Figure 10:
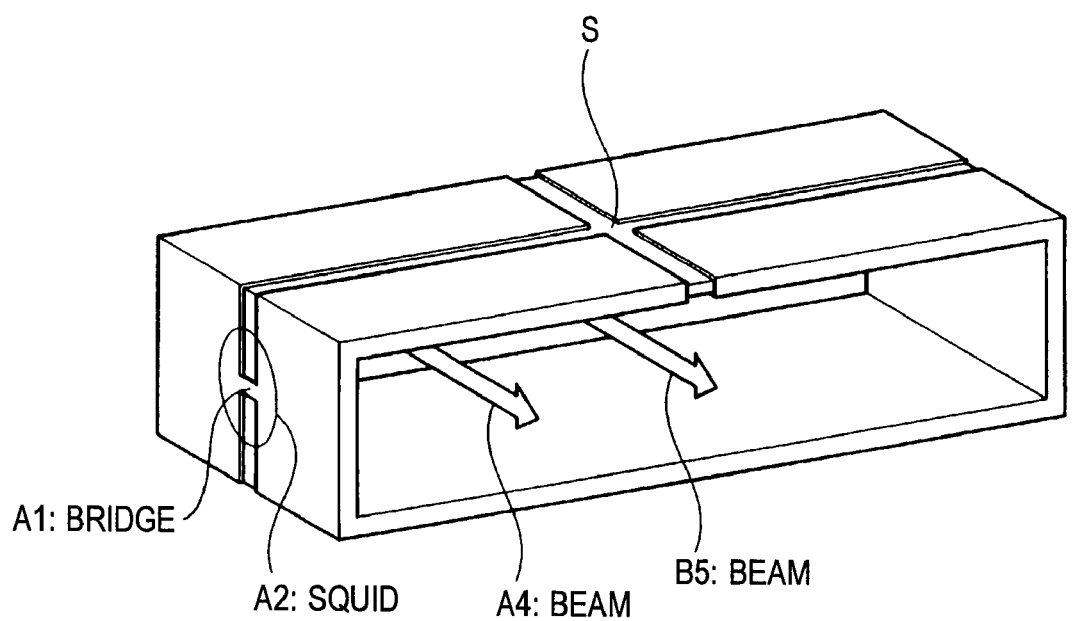
FIG. 10 is a view for explaining the relationship between a magnetic field sensor and beam positions of a fifth embodiment of the present invention.
Figure 11:
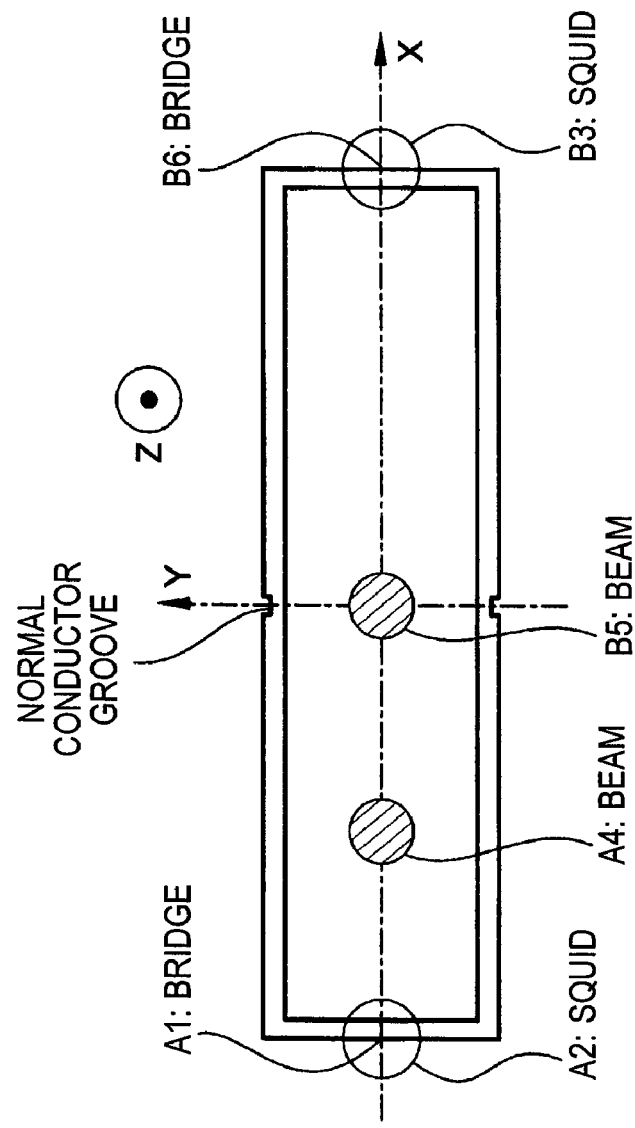
FIG. 11 is a view showing a schematic appearance of the magnetic field sensor of the fifth embodiment of the present invention.
Figure 11:
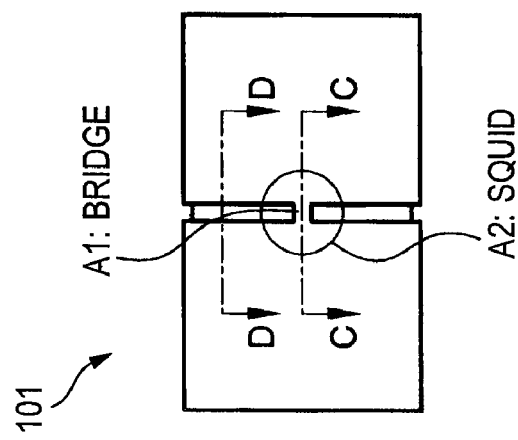

This embodiment shown in FIG. 10, FIG. 11(a) and FIG. 11(b) differs from the above-mentioned embodiments with respect to a point that a slit S which is formed in a portion of an outer wall of a cylindrical structural body in the beam direction and is also formed to expose a base body from a superconductive body is formed to penetrate the superconductive body to reach edge faces of the cylindrical structural body. This embodiment is substantially equal to the above-mentioned embodiments with respect to other constitutions.

This embodiment is provided to optimize a shape of the slit S in conformity with a shape of the cylindrical structural body to increase the above-mentioned position sensitivity coefficient as large as possible.

Sixth Embodiment

Figure 12:
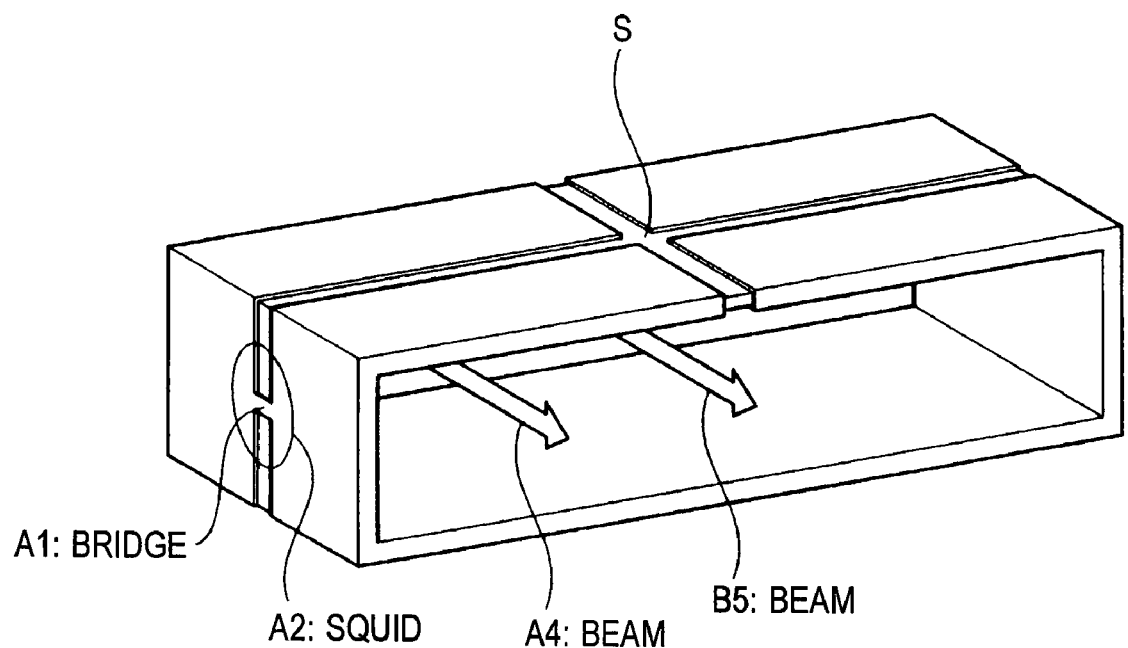
FIG. 12 is a view for explaining the relationship between a magnetic field sensor and beam positions of a sixth embodiment of the present invention.
Figure 13:
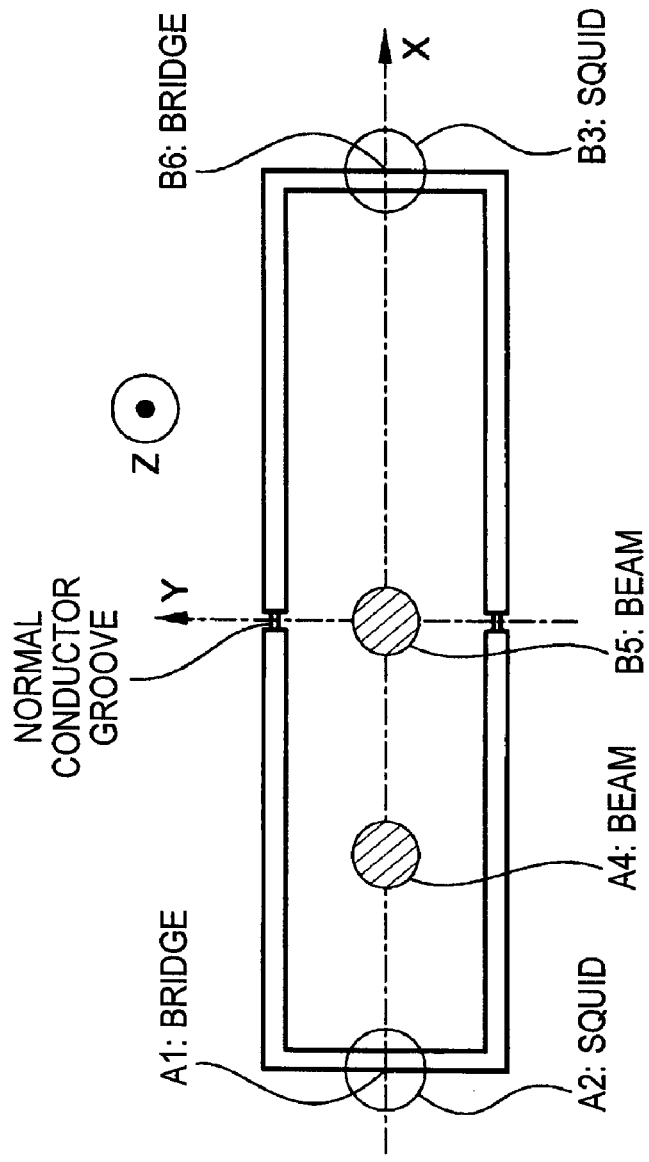
FIG. 13 is a view for explaining the relationship between the magnetic field sensor and beam positions of the sixth embodiment of the present invention.
Figure 13:
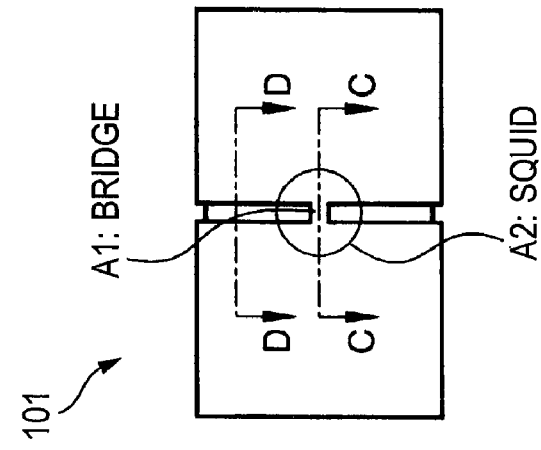

This embodiment shown in FIG. 12, FIG. 13(a) and FIG. 13(b) differs from the above-mentioned fifth embodiment with respect to a point that a slit S which is formed to expose a base body from a superconductive body is formed to penetrate edge faces of the cylindrical structural body. This embodiment is substantially equal to the above-mentioned embodiments with respect to other constitutions.

By dividing a superconductive region along the direction of the beam in this manner, the beam position is more clearly reflected thus enhancing the detection accuracy of the beam position.

Seventh Embodiment

Figure 14:
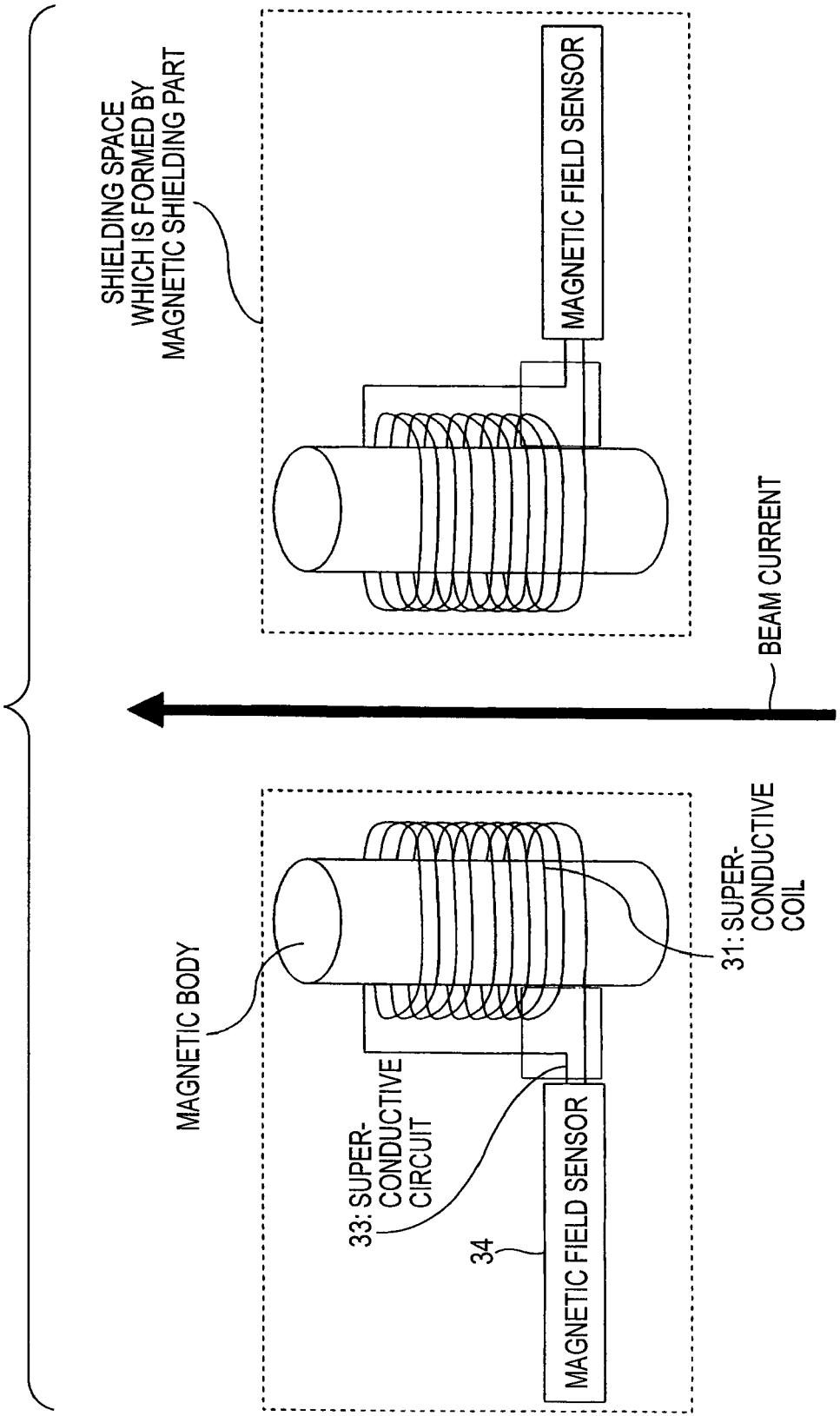
FIG. 14 is a view for explaining the relationship between a magnetic field sensor and beam positions of a seventh embodiment of the present invention.

FIG. 14 shows another example of the magnetic field collection mechanism. In this embodiment, two superconductive coils are provided as the magnetic field collection mechanism. In this example, in each magnetic field collection mechanism, a superconductive core 32 which is formed of a magnetic body is wound around by a superconductive coil 31 and a magnetic field is introduced to a magnetic field sensor 34 by way of a superconductive circuit 33 so that the magnetic field is detected. Due to such a constitution, it is possible to detect the magnetic field without always arranging the magnetic field sensor in the vicinity of a beam current. This embodiment is substantially equal to the above-mentioned embodiments with respect to other constitutions.

Here, a core which constitutes a superconductive core is not always necessary and it is sufficient so long as a plurality of superconductive coils is provided.

As described above, according to the embodiments of the present invention, it is possible to simultaneously measure the beam position and the beam current value.

Next, a comparison example is explained.

Figure 15:
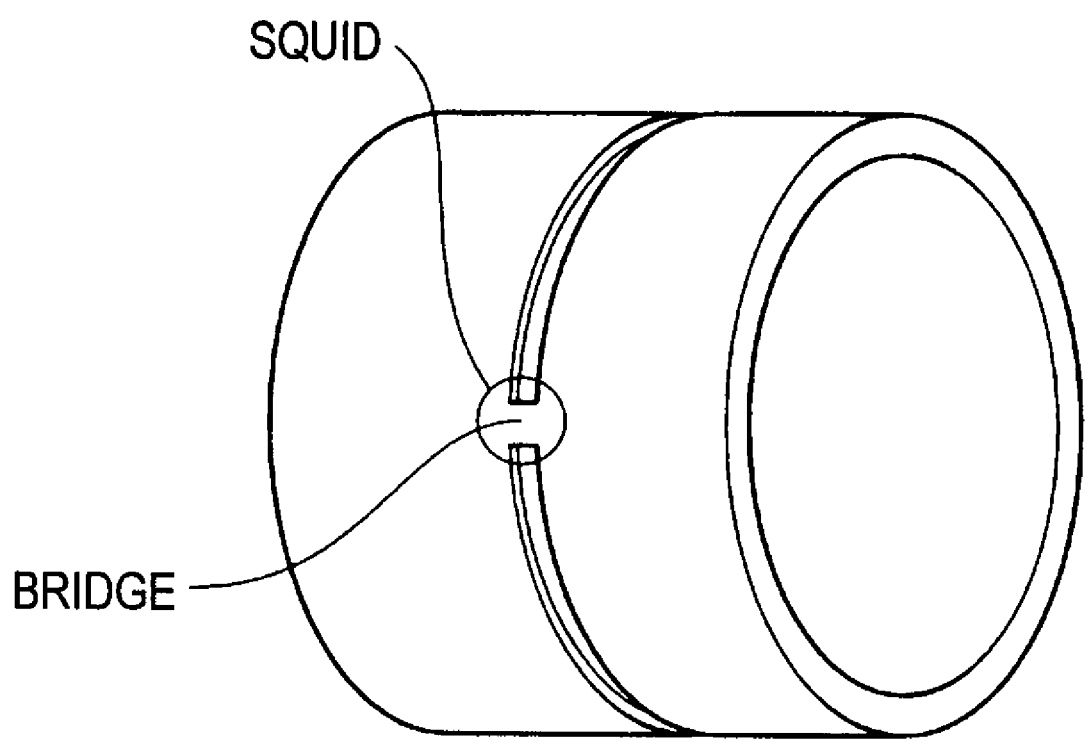
FIG. 15 is a view showing a schematic appearance of the magnetic field sensor of a comparison example.

FIG. 15 shows the constitutions of a mechanism which collects a magnetic field and a SQUID which are used in a beam current measuring device of the comparison example. As the mechanism which collects the magnetic field, a cylindrical structural body which has a surface thereof coated with a high-temperature super conductive body and has a bridge portion which has only a portion thereof formed of a high-temperature superconductive body on the outer peripheral portion thereof is used. Here, the mechanism which collects the magnetic field has one bridge and one SQUID. The constitution of the comparison example includes only one bridge and hence, a surface shielding current flows to the bridge which is formed of a superconductive body and has zero resistance in a concentrated manner. That is, the surface shielding current induced on the surface of the cylindrical body is concentrated on one bridge. In this manner, a magnetic field which a beam current to be measured generates is collected, and the magnetic field which the concentrated surface shielding current generates at the bridge portion is detected by the detection coil and is measured by the SQUID.

Here, even when the position of the beam which passes a closed curved surface which an inner diameter of the cylinder forms is changed, a sum of the surface shielding currents induced on the inner wall surface of the cylinder by the magnetic field which is generated the beam is not changed and hence, the beam current can be measured irrelevant to the beam position. Accordingly, as described in the conventional example, the beam current of several μA can be measured in a non-destructive manner using the high-temperature superconductive body. However, it is impossible to measure the beam position in the comparison example.

INDUSTRIAL APPLICABILITY

As has been explained heretofore, according to the present invention, the beam current value can be measured with high accuracy in a non-destructive manner and, at the same time, the beam position can be measured and hence, the position and the beam current value can be adjusted with high accuracy whereby the beam measuring device is reliably used in fine machining steps.

The invention claimed is:

1. A beam measuring device comprising:
a magnetic shielding part, shielding an outer magnetic field; and
a plurality of magnetic field sensors, arranged in a shielding space which is formed by the magnetic shielding part, the magnetic field sensors measuring a magnetic field which a beam current to be measured generates;
wherein the magnetic field sensor includes a plurality of magnetic field collection mechanisms which collect magnetic fields which the beam current to be measured generates; wherein the magnetic field collection mechanisms are arranged such that a superconductive surface shielding current is concentrated on a predetermined region by interrupting the superconductive surface shielding current except for a predetermined region on a superconductive surface of the magnetic field collection mechanisms;
wherein the magnetic field collection mechanism is a pipe-shaped structural body which has at least a surface thereof formed of a superconductive body and includes a bridge portion which has only a portion thereof constituted of a high-temperature superconductive body on an outer peripheral portion; and
wherein the magnetic field collection mechanism concentrates a superconductive surface shielding current which the beam current generates in the vicinity of a plurality of magnetic field sensors.

2. The beam measuring device according to claim 1, wherein an insulator is arranged at the outer wall of the cylindrical structural body in a state that the respective bridge portion is partitioned so that output of each of the magnetic field sensors can easily reflect location of the beam positions.

3. The beam measuring device according to claim 1, wherein a normal conductor is arranged at the outer wall of the cylindrical structural body in a state that the respective bridge portion is partitioned so that output of each of the magnetic field sensors can easily reflect location of the beam positions.

4. The beam measuring device according to claim 1, wherein output signals of the plurality of magnetic field sensors are connected to an arithmetic operation circuit which calculates and outputs a current value and a position of the beam current.

5. The beam measuring device according to claim 1, wherein output signals of the plurality of magnetic field sensors are connected to an arithmetic operation circuit which calculates and outputs a current value and a position of the beam current while canceling noise signals having a same phase as the output signals of the plurality of magnetic field sensors.

6. The beam measuring device according to claim 1, wherein the magnetic field sensor is a SQUID.

7. The beam measuring device according to claim 1, wherein the magnetic shielding part, the magnetic field sensor and the magnetic filed collection mechanism include parts which are formed of a high-temperature superconductive body.

8. A beam measuring method which uses the beam measuring device described in claim 1, arranges the beam measuring device on the beam line which is radiated to a material to be treated from an ion source or an electron beam source, and measures the beam current value of the beam line and the position of beams based on outputs of the magnetic field sensors.

9. A beam control method comprising; a measurement step which measures a beam current of beams which are generated by an ion source or an electron beam source using the beam measuring method described in claim 8; and a control step which feedbacks the beam current value and positions of beams which are obtained by the measuring step or both of the beam current value and the positions of beams to control parameters of the ion source, the electron beam source, an analysis electric magnet, a part for applying an electric field and a magnetic field to beams.

10. The beam control method according to claim 9, wherein the beam radiation method includes a radiation step which radiates the beam current which is controlled using the control parameters obtained in the control step of the beam in claim 12 to a material to be treated.

11. The beam measuring method according to claim 8, wherein the beam current value of the beam line and the beam position are simultaneously measured.

12. A beam radiation device which includes the beam measuring device described in claim 1.

13. A material to be treated which is manufactured or inspected casing an ion injection device, an electronic beam exposure device, an accelerator or an electron beam vapor deposition device which includes the beam measuring device described in claim 1.

* * * * *

UNITED STATES PATENT AND TRADEMARK OFFICE
CERTIFICATE OF CORRECTION

| | |
|---|---|
| PATENT NO. | : 7,535,220 B2 |
| APPLICATION NO. | : 10/597838 |
| DATED | : May 19, 2009 |
| INVENTOR(S) | : Yuichiro Sasaki et al. |

It is certified that error appears in the above-identified patent and that said Letters Patent is hereby corrected as shown below:

In Column 2, line 58, please delete "cannot" and insert --can not--.

In Column 3, line 61, please delete "maybe" and insert --may be--.

In Column 3, line 62, please delete "maybe" and insert --may be--.

In Column 12, line 31, please delete the text beginning in Column 12, line 31 and ending in Column 12, line 55, and insert therefor --9. The beam measuring method according to claim 8, wherein the beam current value of the beam line and the beam position are simultaneously measured.

10. A beam control method comprising; a measurement step which measures a beam current of beams which are generated by an ion source or an electron beam source using the beam measuring method described in claim 8; and a control step which feedbacks the beam current value and positions of beams which are obtained by the measuring step or both of the beam current value and the positions of beams to control parameters of the ion source, the electron beam source, an analysis electric magnet, a part for applying an electric field and a magnetic field to beams.

11. The beam control method according to claim 10, wherein the beam radiation method includes a radiation step which radiates the beam current which is controlled using the control parameters obtained in the control step of the beam in claim 12 to a material to be treated.

12. A beam radiation device which includes the beam measuring device described in claim 1.

UNITED STATES PATENT AND TRADEMARK OFFICE
CERTIFICATE OF CORRECTION

PATENT NO. : 7,535,220 B2
APPLICATION NO. : 10/597838
DATED : May 19, 2009
INVENTOR(S) : Yuichiro Sasaki et al.

It is certified that error appears in the above-identified patent and that said Letters Patent is hereby corrected as shown below:

13. A material to be treated which is manufactured or inspected casing an ion injection device, an electronic beam exposure device, an accelerator or an electron beam vapor deposition device which includes the beam measuring device described in claim 1.--.

Signed and Sealed this

Twenty-fifth Day of August, 2009

David J. Kappos
*Director of the United States Patent and Trademark Office*

UNITED STATES PATENT AND TRADEMARK OFFICE
CERTIFICATE OF CORRECTION

PATENT NO. : 7,535,220 B2  Page 1 of 1
APPLICATION NO. : 10/597838
DATED : May 19, 2009
INVENTOR(S) : Yuiciro Sasaki et al.

It is certified that error appears in the above-identified patent and that said Letters Patent is hereby corrected as shown below:

In Column 12, line 41 please delete "10. The beam control method according to claim 9, wherein the beam radiation method includes a radiation step which radiates the beam current which is controlled using the control parameters obtained in the control step of the beam in claim 12 to a material to be treated." and insert therefor --10. The beam control method according to claim 9, wherein the beam radiation method includes a radiation step which radiates the beam current which is controlled using the control parameters obtained in the control step of the beam in claim 9 to a material to be treated.--

In Column 12, line 51 please delete "13. A material to be treated which is manufactured or inspected casing an ion injection device, an electronic beam exposure device, an accelerator or an electron beam vapor deposition device which includes the beam measuring device described in claim 1." and insert therefor --13. A material to be treated which is manufactured or inspected using an ion injection device, an electronic beam exposure device, an accelerator or an electron beam vapor deposition device which includes the beam measuring device described in claim 1.--

Signed and Sealed this

Thirteenth Day of July, 2010

David J. Kappos
*Director of the United States Patent and Trademark Office*